US006496380B1

(12) United States Patent
Li et al.

(10) Patent No.: US 6,496,380 B1
(45) Date of Patent: *Dec. 17, 2002

(54) HIGH CAPACITY MEMORY MODULE WITH HIGH ELECTRICAL DESIGN MARGINS

(75) Inventors: Che-Yu Li, Ithaca; David A. Lysack, Liverpool; Thomas L. Sly, Cicero, all of NY (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/645,859

(22) Filed: Aug. 24, 2000

(51) Int. Cl.[7] ................................................ H05K 7/02
(52) U.S. Cl. ...................... 361/760; 361/788; 361/785; 710/101; 710/102; 362/51; 362/52; 362/63
(58) Field of Search ................................ 361/760, 788, 361/784–785, 781, 832, 828; 439/61; 710/101–102; 365/52, 51, 63

(56) References Cited

U.S. PATENT DOCUMENTS

| 5,530,623 A | * | 6/1996 | Sanwo et al. ............... 361/788 |
| 5,793,998 A | * | 8/1998 | Copeland et al. ........... 395/309 |
| 6,070,217 A | * | 5/2000 | Connolly et al. ........... 710/131 |
| 6,172,895 B1 | * | 1/2001 | Brown et al. ................ 365/63 |
| 6,202,110 B1 | * | 3/2001 | Coteus et al. ............... 710/102 |
| 6,266,252 B1 | * | 7/2001 | Karabatsos ................. 361/788 |

* cited by examiner

Primary Examiner—David Martin
Assistant Examiner—Thanh Y. Tran
(74) Attorney, Agent, or Firm—Salzman & Levy

(57) ABSTRACT

The present invention features a memory module for use in conjunction with high speed, impedance-controlled buses. Each memory card may be a conventional printed circuit card with memory chips attached directly thereto. Alternately, high density memory modules assembled from pluggable sub-modules may be used. These sub-modules may be temporarily assembled for testing and/or burn-in. Bus terminations mounted directly on the memory card or the memory module eliminate the need for bus exit connections, allowing the freed-up connection capacity to be used to address additional memory capacity on the module. An innovative pin-in-hole contact system is used both to connect sub-modules to the memory module and, optionally, to connect the memory module to a motherboard or similar structure. A thermal control structure may be placed in the memory module, cooling the increased number of memory chips to prevent excess heat build-up and ensure reliable memory operation.

17 Claims, 8 Drawing Sheets

HIGH CAPACITY MEMORY MODULE WITH HIGH ELECTRICAL DESIGN MARGINS

RELATED PATENT APPLICATIONS

This application is related to U.S. Pat. No. 5,928,005, issued to Li et al. for SELF-ASSEMBLED LOW INSERTION FORCE CONNECTOR ASSEMBLY, and U.S. Pat. No. 6,172,895, issued to Brown et al. for HIGH CAPACITY MEMORY MODULE WITH BUILT-IN-HIGH-SPEED BUS TERMINATIONS; copending U.S. patent application Ser. No. 09/461,069; and U.S. patent application Ser. No. 09/461,064, now abandoned, all of which are hereby incorporated by reference.

FIELD OF THE INVENTION

The present invention relates to high density memory modules and, more particularly, to high density memory modules having impedance-controlled transmission line buses and, optionally, driver line terminators built into the memory modules, for maintaining high electrical design margins.

BACKGROUND OF THE INVENTION

Modern, high-speed digital computers and the sophisticated software running on them require ever-increasing amounts of volatile random access memory (RAM). As bus and clock speeds increase, the electrical drive requirements for servicing a number of memory devices have become much more stringent than when slower memory was in use.

The operating speed of a memory system is largely determined by the electrical interconnections between the memory controller and the memory devices, or the bus. As data rate increases, signal propagation times through the interconnections are no longer negligible compared to the transition time of the signals. At high bus speeds, these interconnections behave as transmission line networks. The response characteristics of such transmission line networks determine the maximum usable speed of the memory bus.

In the current generation of memory packaging technology, the amount of memory physically available on a single card or module is controlled by two factors: the capacity of the memory devices (chips) themselves and the number of physical electrical connections that may be made to the module. The number of cards or modules which may be daisy chained is dependent solely upon the capacity of the line drivers or receivers. To ensure fast memory cycle times, extremely short, fast rise pulses are used.

For example, in conventional random access memory systems, because only one bit can exist on the bus during a certain time interval, the bus speed is determined mainly by the signal setup time of the bus. As a result, the highest achievable data rate for such bus in PC memory systems is 266 Mbits per second. Usually, no impedance-matching termination is required or provided in such a conventional RAM system.

To achieve even higher bus speeds and, at the same time, allow for larger memory capacities, impedance controlled types of buses must be adopted. For example, RAMBUS® technology, created by Rambus Inc. of Mountain View, Calif. features a memory configuration wherein memory devices are disposed (packaged) on up to three RAMBUS Inline Memory Module (RIMM) cards all interconnected on a motherboard by a high-speed data bus. One or more termination components are placed on the motherboard at the physical end of the bus.

In operation, address/data lines leave driver circuits on the motherboard and enter a first RIMM card in the memory chain. These same address/data lines must leave the RIMM via a complete, second set of connections. This routing continues through a second and third RIMM module before the driver lines reach their terminations. This memory/bus configuration allows very fast transit signals to be transmitted between a memory controller and a data storing device over relatively long buses. These buses allow multiple bits to propagate simultaneously down each line of the bus, thereby achieving access data rates of 800 Mbits per second. Even higher bus rates appear feasible in the future.

One most important feature of such bus is that the effective impedance of the signal propagation paths is well controlled, and one end of the bus is terminated to the characteristic impedance of the bus in order to maintain signal fidelity and signal integrity.

In systems adopting such buses, the amplitudes of the driving signals are generally much smaller than amplitudes of conventional digital signals. This is due to the limitation on the driving strength (dv/dt) of the devices.

All of the above mentioned factors make reliable operation very dependent upon controlling the impedance of the interconnections along the bus. Any impedance mismatches along the signal transmission path result in signal degradation which, in turn, may lead to errors in data transmission. At the same time, maintenance of accurate timing among all of the signal bits and clocks is also extremely critical to reliable data transmission. For this reason, minimizing signal-to-clock delay difference (data-to-clock skew) is another important requirement for such buses.

Prior art memory system designs generally consist of a memory controller, a clock driver and bus terminations all mounted on the motherboard with up to three memory slots between the controller and the termination. The data signals must pass through every module and also through a total of six edge connectors before they reach the termination. Because of their design, current edge connectors introduce impedance mismatches and crosstalk that degrade signal quality and therefore limit the performance of the signal channels.

The inclusion of the terminations on the memory modules themselves provides several types of performance improvement. First, because only a single set of contacts need be used (i.e., there is no need to have the bus lines exit the module), the additional contact capacity may be devoted to addressing capability for even greater amounts of memory on a single card or module. For example, current RAMBUS technology RIMM cards support only eight or sixteen memory chips with a total capacity of no more than 256 Mbits per card. The memory modules of the present invention, however, can hold up to 32 chips per card, thereby providing a double to quadruple improvement in memory capacity. By eliminating essentially half of the required contacts, an even greater number of chips (e.g., 64 chips) may be packaged on a single card.

Total bus path length is significantly reduced because more memory may be placed on a single card physically much closer to the driver circuits than has heretofore been possible. Even more improvement is obtained because the extra passage of signals through exit contacts is eliminated. Also eliminated is that portion of the bus path between the memory modules and the external terminator resistors of the prior art.

In addition, this inventive design may reduce the design complexity and manufacturing cost of both the memory module and the motherboard. For memory systems having one to three memory modules, using a terminated module as the last module helps to achieve maximum system performance.

The present invention also allows integration of all of the memory chips of a channel onto a single, terminated module, which leads to better system integrity and lower cost. The inventive, self-terminated module needs only half of the I/O connections of a conventional module. Using a conventional prior art connector on a module, two channels of memory can be integrated onto one module, which yields increased bandwidth and double the memory capacity.

When the inventive, self-terminating memory modules are combined with innovative pin/hole interconnection technology, densities are achieved that are much higher than have been possible heretofore. This allows far more memory to be packaged on a single memory module or card. More memory capacity may be deployed closer to the line drivers/receivers, thereby reducing path lengths, especially when a memory module is self-terminated.

Thermal management structures may be included on the high density, self-terminated memory modules. These structures are described in detail in copending U.S. patent application, Ser. No. 09/461,065.

It is therefore an object of the invention to provide a compact, high density memory card with up to 64 memory chips supported thereon.

It is an additional object of the invention to provide a high density memory module utilizing a novel high density connector technology.

It is an additional object of the invention to provide a high density memory module with high electrical design margins.

It is another object of the invention to provide a high density memory module with bus terminations provided on the memory module itself.

It is a still further object of the invention to provide a high density memory module which can operatively reduce data path lengths, thereby helping ease driver electrical requirements in a high speed digital computer or the like.

It is another object of the invention to provide a high density memory module made from detachable sub-modules which may be temporarily connected together for testing and/or burn-in and then, optionally, permanently attached to the module.

It is yet another object of the invention to provide a single, high density memory module containing all of the memory capacity supported by a single bus channel or dual bus channels.

SUMMARY OF THE INVENTION

The present invention provides a memory module with bus terminations mounted directly on the memory module for use with high speed, impedance-controlled memory buses. The memory module has high electrical design margins and may be formed on a conventional printed circuit card with unpacked or packed memory chips attached directly to the memory module. Alternately, high density memory modules assembled from pluggable sub-modules or daughter cards may be used. These sub-modules may be temporarily assembled for testing and/or burn-in. Using memory modules with bus terminations mounted directly on the module improves the signal quality and integrity and therefore enhances the performance of the systems. Such designs may also eliminate the need for bus exit connections, thereby allowing the freed-up connection capacity to be used to address additional memory capacity on the module. Thermal control structure may be included to maintain the high density memory modules within a reliable range of operating temperatures.

BRIEF DESCRIPTION OF THE DRAWINGS

A complete understanding of the present invention may be obtained by reference to the accompanying drawings, when taken in conjunction with the detailed description thereof and in which:

FIG. 2b is a top view of the prior art memory card shown in FIG. 2a;

FIG. 2c is a side view of the prior art memory card shown in FIG. 2a;

DETAILED DESCRIPTION OF THE PREFERRED EMBODIMENT

Generally speaking, the present invention is a high density memory card or module made either from bare memory chips or conventional memory chip packages mounted on memory cards or on demountable memory sub-modules (daughter cards). These memory cards or modules have built-in bus terminations and, optionally, thermal management structures.

Figure 1:
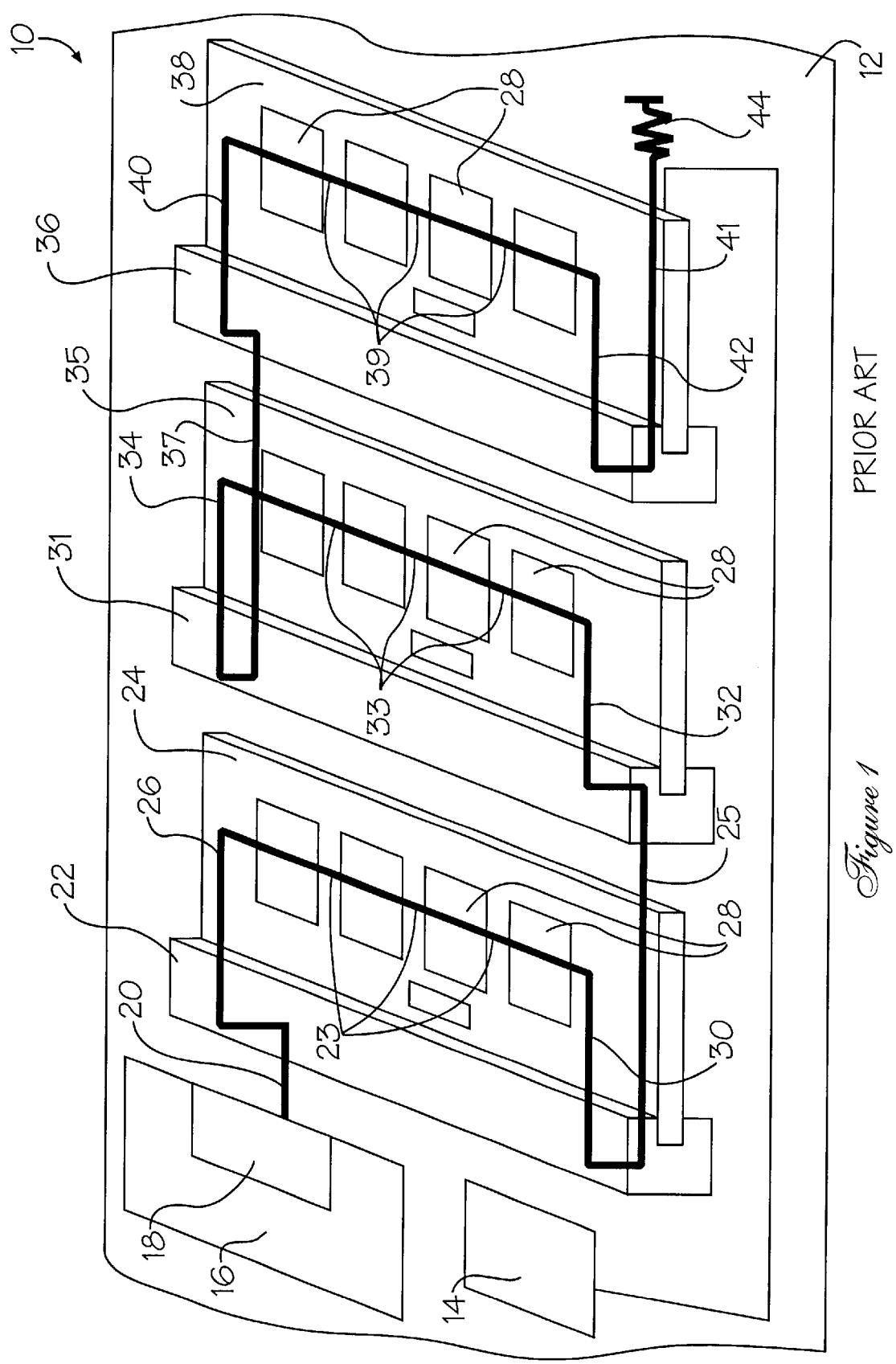
FIG. 1 is schematic representation of a multi-card memory arrangement of the prior art with bus termination on the motherboard.

Referring first to FIG. 1, there is shown a schematic representation of a multi-card (three-card) memory system 10 of the prior art. Conventional two-slot and three-slot boards required terminations on the motherboard 12, which were needed even when all slots were not used. Of course, in that situation, signal quality could be proportionally degraded by the module connectors, which provide signal paths between memory modules and circuitry on the motherboard.

A portion of a motherboard 12 is shown with support circuitry needed for implementing the RAMBUS memory system. A Direct RAMBUS Clock Generator (DRCG) circuit 14 and a master device 16 containing a Direct RAMBUS ASIC Cell (RAC) 18 are implemented on motherboard 12. The RAMBUS channel segment 20 connects RAC 18 to a first memory socket 22, which is physically connected to motherboard 12. RAMBUS channel segment 20 connections are generally made by internal printed wiring traces (not shown). First socket 22 generally has a plurality of spring-loaded contacts designed to engage mating contact pads on a first RIMM card 24.

In the RAMBUS architecture, generally 184 contacts are provided on each memory module. RAMBUS channel segment 20 enters RIMM card 24 at a bus entry region 26 and is then connected to a number of individual memory devices 28 attached to RIMM card 24 through device connection segments 23. The RAMBUS channel next exits RIMM card 24 via a RAMBUS channel exit region 30, and passes from first RIMM card 24 back to motherboard 12. Additional printed wiring traces carry the RAMBUS channel segment 25 to a second socket 31 also on motherboard 12. Second socket 31 holds a second RIMM card 35.

A RAMBUS channel entry portion 32, a series of memory devices 28, a series of device connection segments 33, and a RAMBUS channel exit portion 34 make up second RIMM card 35. In a similar fashion, RAMBUS channel segment 37, connected through printed circuit traces, to the exit portion 34, a third socket 36, third RIMM card 38, third series of device connection segments 39, RAMBUS channel entry portion 40, and RAMBUS channel exit portion 42, make up the third RAMBUS memory card. RAMBUS channel segment 41 finally reaches terminations 44 at the end of the circuitous routing of the bus after passing through printed circuit traces.

Termination components, such as resistors, blocking capacitors and/or decoupling capacitors 44 are also placed on motherboard 12. All RAMBUS channel signals must pass through three sockets 22, 31, 36 and across three RIMM cards 24, 35, and 38 before reaching terminations 44. The driver requirements to reliably access memory devices 28 on the three RIMM cards 24, 35, 38 are stringent. Signal degradation occurs along the path of the RAMBUS channel, especially at connectors 22, 31, and 36. In addition, valuable "real estate" is consumed on the motherboard 12, itself.

Figure 2A:
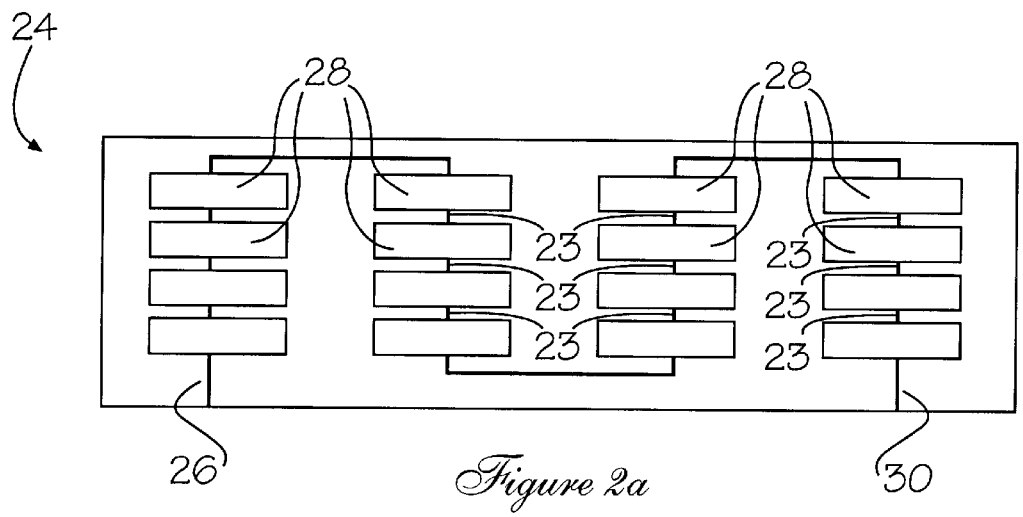
FIG. 2a is a front, plan view of the prior art memory card shown in FIG. 1.
Figure 2B:
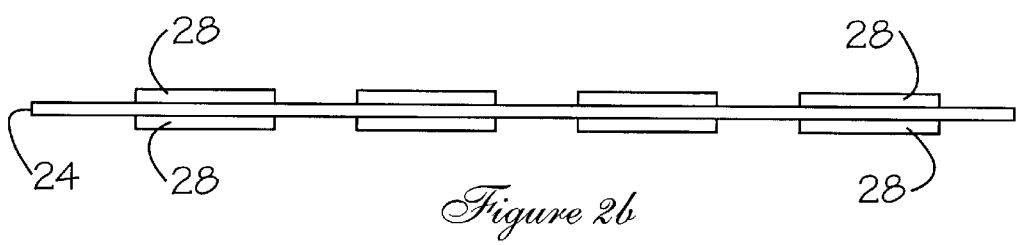
Figure 2C:
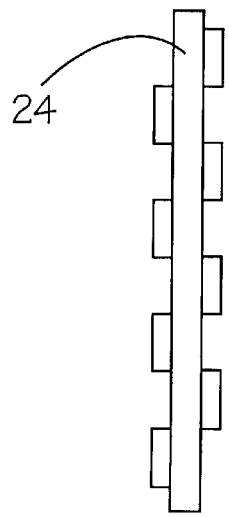

Referring now to FIGS. 2a, 2b, and 2c, there are shown front, top and side views, respectively, of the typical prior art RIMM card 24 shown in FIG. 1. Memory devices 28 are arranged in four vertical rows of four modules each; however, other physical arrangements could also be used. RAMBUS channel segment 20 (FIG. 1) enters card 24 at a bus entry region 26 and is then connected to memory devices 28 through device connections segments 23. The RAMBUS channel 20 next exits RIMM card 24, via a RAMBUS channel exit region 30, and passes out of first RIMM card 24 and back to motherboard 12 (FIG. 1).

FIG. 2b is a top view of the RIMM card of FIG. 2a showing memory devices 28 disposed on both sides of RIMM card 24.

FIG. 2c is a side view of the RIMM card of FIG. 2a also showing memory devices 28 disposed on RIMM card 24.

Figure 3:
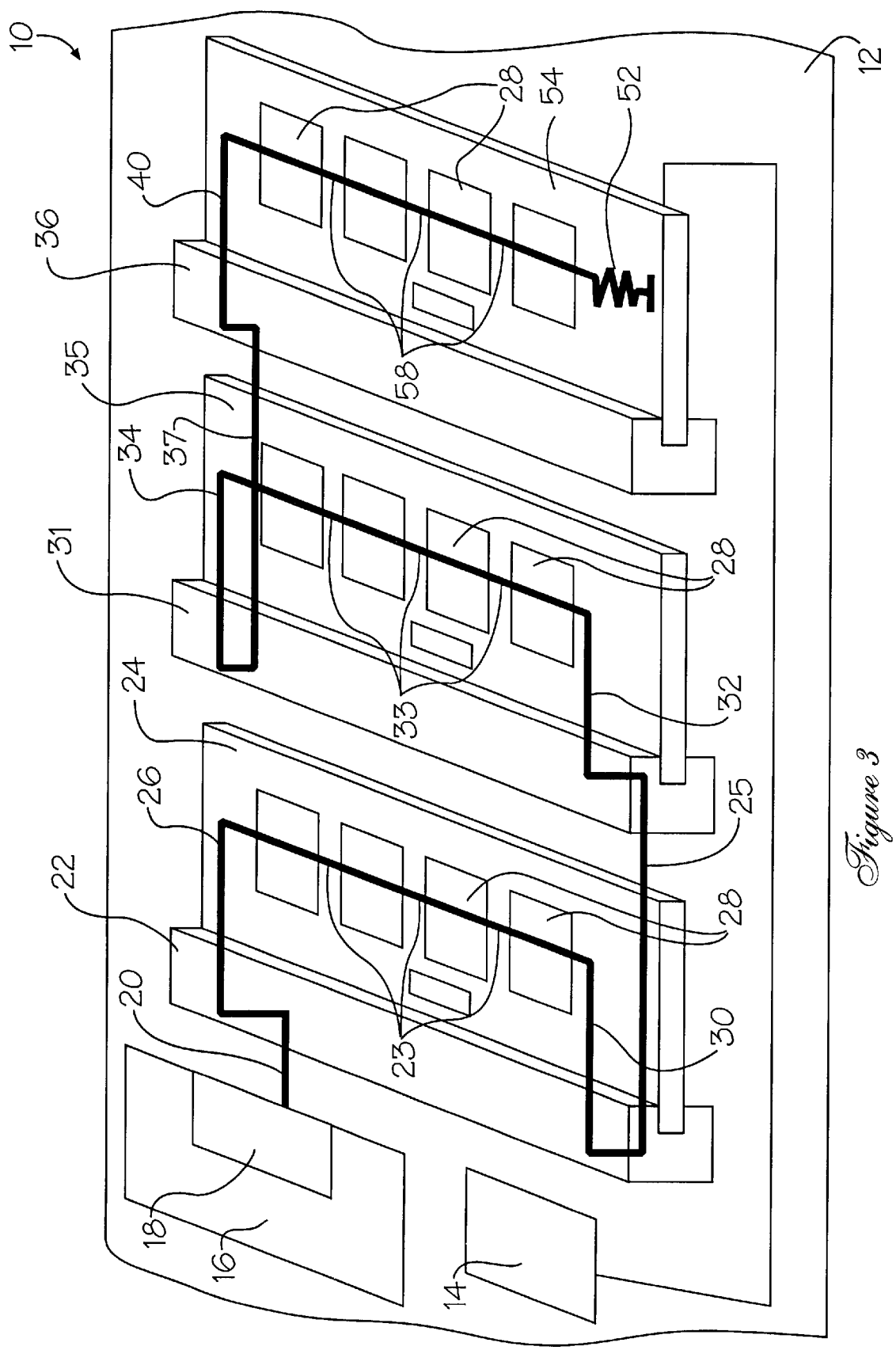
FIG. 3 is a schematic representation of a memory arrangement of the present invention with bus termination on the last memory module.

Referring now to FIG. 3, there is shown a schematic representation of a memory system 10 with the inventive memory module. A portion of a motherboard 12 is again shown with support circuitry needed for implementing the RAMBUS memory system. A Direct RAMBUS Clock Generator (DRCG) circuit 14 and a master device 16 containing a Direct RAMBUS ASIC Cell (RAC) 18 are implemented on motherboard 12 in the same manner as in the prior art memory card implementation shown in FIG. 1 and discussed hereinabove.

The RAMBUS channel segment 20 connects RAC 18 to a first memory socket 22, which is physically connected to motherboard 12. RAMBUS channel segment 20 connections are generally made by printed wiring traces (not shown) on one or both surfaces of motherboard 12. Alternately, an internal printed wiring trace (not shown) can be used for connections. Socket 22 generally has a plurality of spring-loaded contacts designed to engage mating contact pads on a RIMM card 24.

RAMBUS channel segment 20 enters RIMM card 24 at a bus entry region 26 and is then connected to a number of individual memory devices 28 attached to RIMM card 24 through device connection segments 23. The RAMBUS channel 20 then exits RIMM card 24, via a RAMBUS channel exit region 30, and passes out of the first RIMM card 24 and back to motherboard 12. Additional printed wiring traces carry the RAMBUS channel segment 25 to a second socket 31 also on motherboard 12. Second socket 31 holds second RIMM card 35. Similarly, the RAMBUS channel 20 exits the second conventional RIMM card and is connected through RAMBUS channel segment 37 to the last RIMM card 54, which also contains bus termination 52. Unlike the prior art, terminations 52 are mounted directly on card 54, thereby eliminating the need for an exit portion of RAMBUS channel 42 (FIG. 1) or RAMBUS channel segment 41. The complete, additional set of contacts is thereby eliminated, allowing their use for addressing additional memory capacity or the like.

Figure 4:
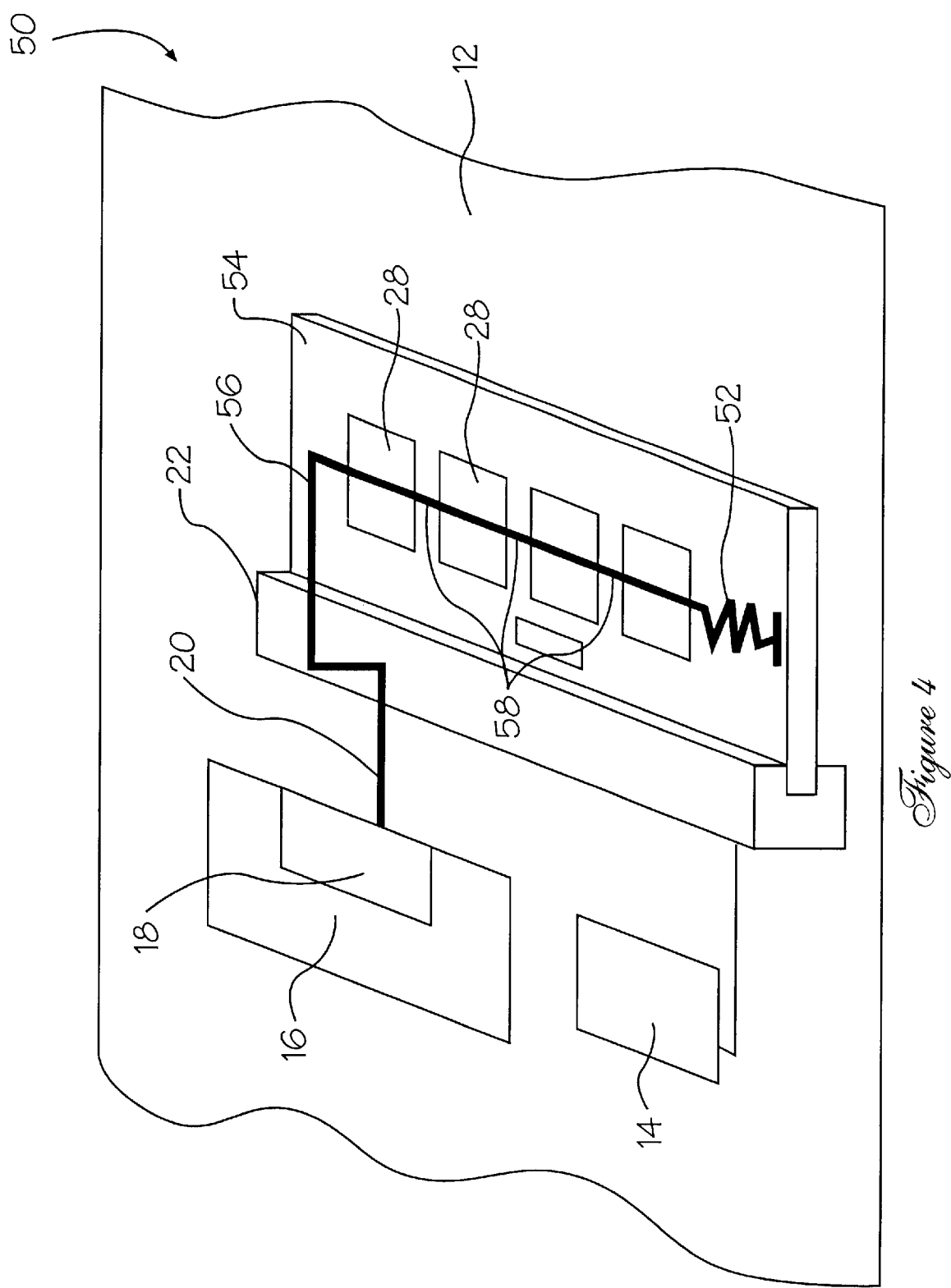
FIG. 4 is a schematic representation of a multi-card memory arrangement of the present invention with bus termination on a memory card.

Referring now to FIG. 4, there is shown a schematic representation of the inventive memory card system 50. A portion of a motherboard 12 is again shown with support circuitry needed for implementation of the RAMBUS memory system. A Direct RAMBUS Clock Generator (DRCG) circuit 14 and a master device 16 containing a Direct RAMBUS ASIC Cell (RAC) 18 are implemented on motherboard 12 in the same manner as in the prior art memory card implementation shown in FIG. 1 and discussed hereinabove.

The RAMBUS channel segment 20 connects RAC 18 to a memory socket 22. Socket 22 is physically connected to motherboard 12 and RAMBUS channel segment 20 connections are generally made by printed wiring traces (not shown) on one or both surfaces of motherboard 12. Alternately, an internal printed wiring trace (not shown) can be used for connections. Socket 22 generally has a plurality of spring-loaded contacts designed to engage mating contact pads on a RIMM card 54.

RAMBUS channel segment 20 enters RIMM card 54 at a bus entry region 56 and is then connected to a number of individual memory devices 28 attached to RIMM card 54. Unlike the prior art, terminations 52 are mounted directly on card 54, thereby eliminating the need for an exit portion of RAMBUS channel 42 (FIG. 1) or RAMBUS channel segment 41. The complete, additional set of contacts is also eliminated.

In a specific application, when comparing the embodiment in FIG. 1 to the embodiment in FIG. 4, based on electrical modeling, the total delay or path length, etc. from master device 18 to the termination was significantly reduced.

Figure 5A:
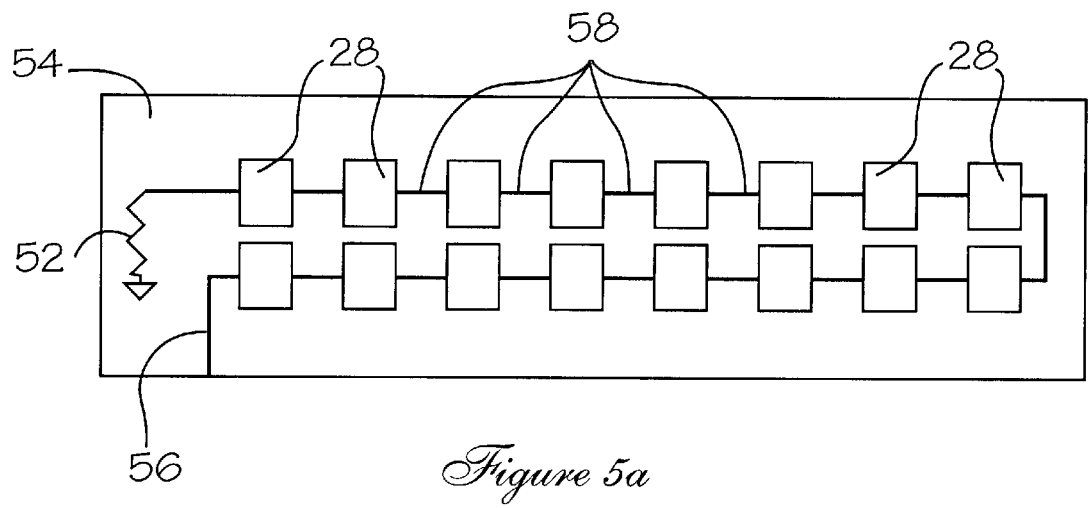
FIG. 5a is a front, plan view of the self-terminating memory card of the invention as shown in FIG. 4.
Figure 5B:
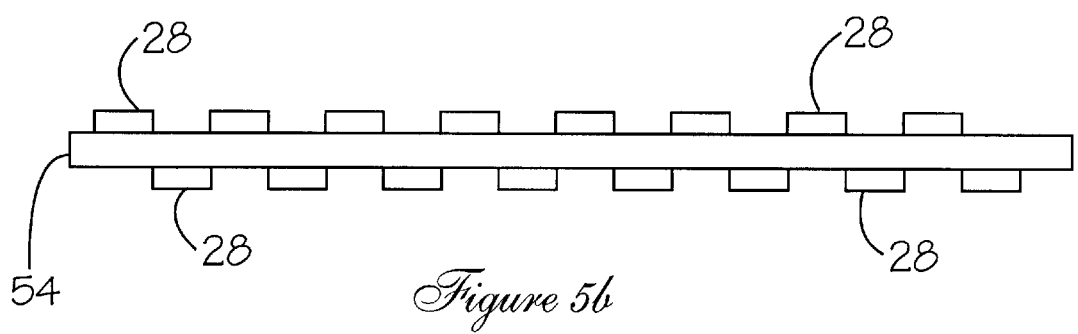
FIG. 5b is a top view of the self-terminating memory card of the invention shown in FIG. 4.
Figure 5C:
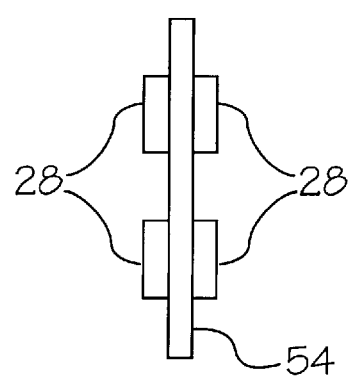
FIG. 5c is an end view of the self-terminating memory card shown in FIG. 4.

Referring now also to FIGS. 5a, 5b and 5c, there are shown front, top and side views, respectively, of a RIMM card 54 having termination on the card as shown in FIG. 4.

Memory devices 28 are arranged in two horizontal rows of eight modules each; however, other physical arrangements could also be used. RAMBUS channel segment 20 (FIG. 4) enters card 54 at a bus entry region 56 and is then connected to memory devices 28 through device connections segments 58. Terminations 52 at the end of the RAMBUS channel 20 are also disposed on card 54.

FIG. 5b is a top view of the RIMM card of FIG. 5a showing memory devices 28 disposed on both sides of RIMM card 54.

FIG. 5c is a side view of the RIMM card of FIG. 5a also showing memory devices 28 disposed on RIMM card 54.

The removal of even one memory card and its associated input and output connections from the memory subsystem provides several possible advantages for system performance. Any reduction of bus length eases the driver requirements for devices on the bus, both reducing cost and improving reliability. It may be seen that, compared to the conventional RAMBUS-based memory subsystems as shown in FIG. 1, the total bus path length, and therefore the total time delay of the inventive memory subsystem as shown in FIG. 4, is significantly reduced not only for the entire subsystem, but also within the given card. For the entire memory subsystem, this is accomplished by increasing the amount of memory on a given card, which reduces the number of cards needed for a given amount of memory. Efficiency is further improved by including the bus termination directly on the final (or only) card, thereby eliminating the additional delay required to reach terminations residing on the motherboard.

The total delay associated with an individual, conventional, RAMBUS-based card 24 as shown in FIG. 2 consists of three components: the delay of the memory devices 28, which is proportional to the number of devices mounted on the card; the delay of the device connection segments 23; and the delay of the RAMBUS channel exit region 30, which connects to either the next card or to the terminations 44. In the improved module as shown in FIG. 5a, the third delay is eliminated since the terminations 52 are located directly on the RIMM card 54 right after the end device 28.

Another factor that is very important in maintaining reliable data transmission through the memory subsystem is to minimize the signal-to-clock delay difference (i.e., the data-to-clock skew). Some of the-factors that contribute to skew are differences in conductor lengths, deviations from the nominal impedance of the printed circuit boards and/or substrates printed circuit traces, and perhaps most importantly, minimizing the number of times that a signal must pass through a connector. The latter is so important because the impedance mismatch of the connector causes reflections, forward crosstalk and reverse crosstalk, all of which act as standing waves that contribute to timing jitter that makes minimizing the skew more difficult.

Comparing FIG. 1 and FIG. 3, it may be seen that signal degradation in the prior art associated with 2½ connector sockets, signal paths between the slots and the termination are eliminated. Generally, higher memory access speeds may be obtained by improving the quality of the RAMBUS channel (i.e., reducing its length, channel delay, crosstalk, etc.). The reduced path length as well as the elimination of at least one socket interface (usually two and one-half sockets may be eliminated) between the RIMM card 54 and the terminations 44 (FIG. 1) both help to reduce crosstalk. Additional motherboard real estate is freed by eliminating the traces between socket 36 (FIG. 1) and terminations 44 (FIG. 1).

Through the computer modeling of electrical performance factors such as reflections and forward and backward crosstalk that contribute to the skew, it is possible to understand the sources of these factors and to use some the time delay budget to null them out to some degree.

The inclusion of the terminations on the memory cards themselves can also be a cost reduction. Since the printed circuit traces going from the end memory device to the output connection contacts are no longer needed, a simpler and less expensive printed circuit board can be used. In one case the memory card printed circuit board was reduced from eight layers to six.

The removal of even one memory card and its associated input and output connections from the memory subsystem provides several possible advantages for manufacturing yields. In one case a memory card that would be out-of-spec from a time delay or data-to-clock skew point of view in a multiple memory card system configuration may very well be acceptable in a single-card configuration. Furthermore, exceeding the impedance specification of the memory card, which may be due to inferior design and/or of failure to control manufacturing processes, results in mismatches that cause signal reflections. These reflections reduce voltage and timing margins that may ultimately cause failures on the memory channel. But because of the removal of other sources of delay and skew in the memory subsystem, these deviations in the impedance of the printed circuit board of the memory card may now be acceptable, thereby improving manufacturing yields.

These changes improve electromagnetic interference (EMI) susceptibility and also reduce radiated radio frequency (RF) emissions from the motherboard 12 and RIMM card 54 combination. Another advantage of placing terminations 44 on the memory card 54 is that less noise is coupled into motherboard 12, potentially enhancing the performance of the entire system.

Figure 6:
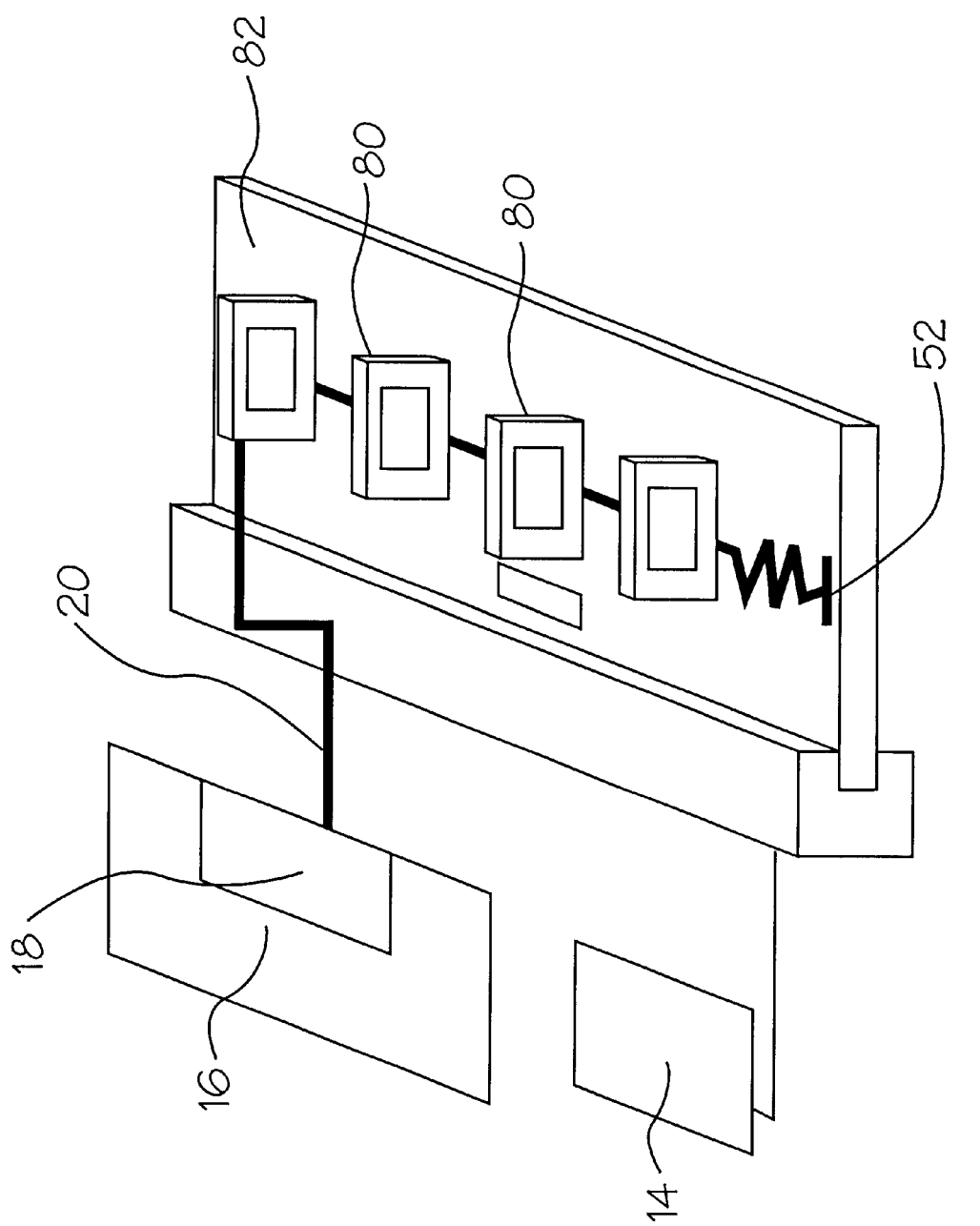
FIG. 6 is a schematic representation of an alternate embodiment of the inventive memory card using daughter cards.

Referring now to FIG. 6, there is shown a schematic representation of an alternate embodiment of the present invention using daughter cards 80 connected to a memory module board 82, typically with pin/hole connection technology (not shown) to improve memory density on memory module board. This embodiment is described in more detail in co-pending patent application Ser. No. 09/461,065. All external features are identical to those described in detail hereinabove (FIG. 4).

Figure 7A:
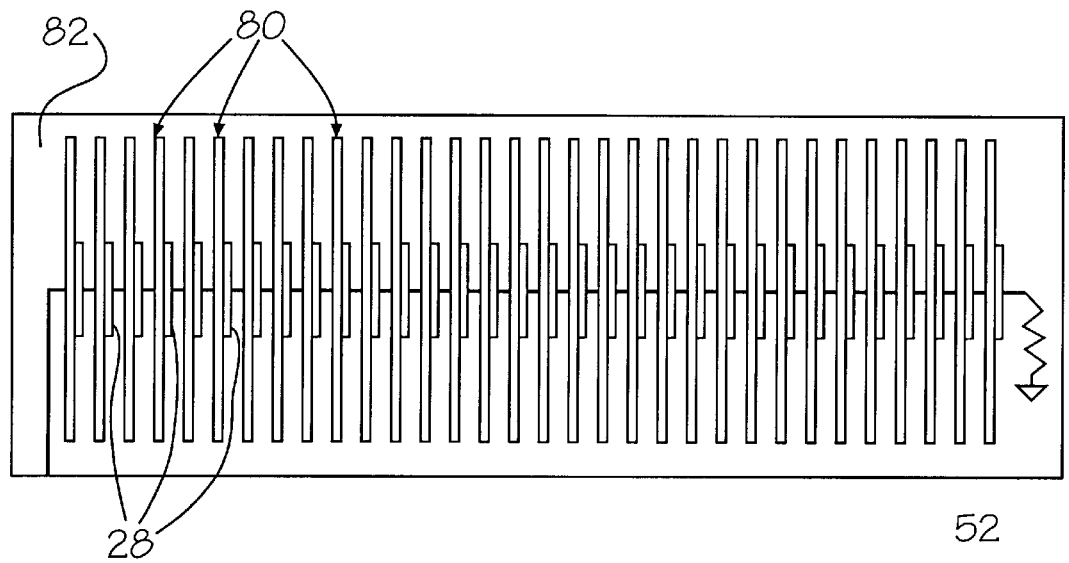
FIG. 7a is a front, plan view of the self-terminating memory card of the invention shown in FIG. 6.
Figure 7B:
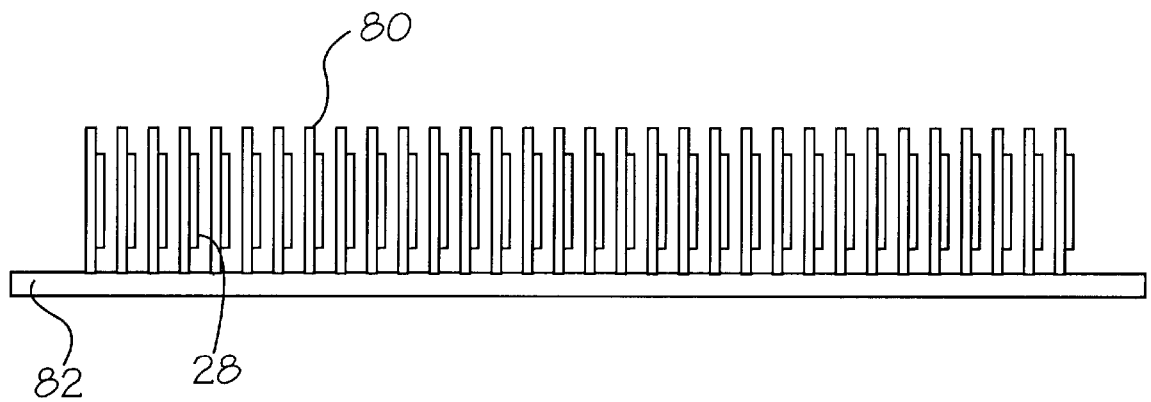
FIG. 7b is a top view of the self-terminating memory card shown in FIG. 6.
Figure 7C:
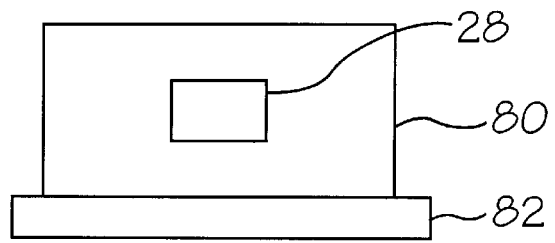
FIG. 7c is front, schematic view of the daughter card shown in FIGS. 7a and 7b.

Referring now also to FIGS. 7a and 7b, there are shown a front schematic and side schematic view, respectively, of daughter cards 80 connected to memory module board 82. Referring also to FIG. 7c, there is shown a front, schematic view of one of the daughter cards 80. Memory devices 28 are disposed on daughter cards 80. A thermal management structure (not shown) is connected to memory devices 28 to dissipate heat. These thermal control structures are described in detail in co-pending patent application Ser. No. 09/461,065.

Pins (not shown) on daughter cards 80 are plugged into receptacles (not shown) on memory module board 82. The inventive pin/hole connectors are also described in detail in co-pending patent application, Ser. No. 09/461,064, as well as in U.S. Pat. No. 5,928,005.

Figure 8:
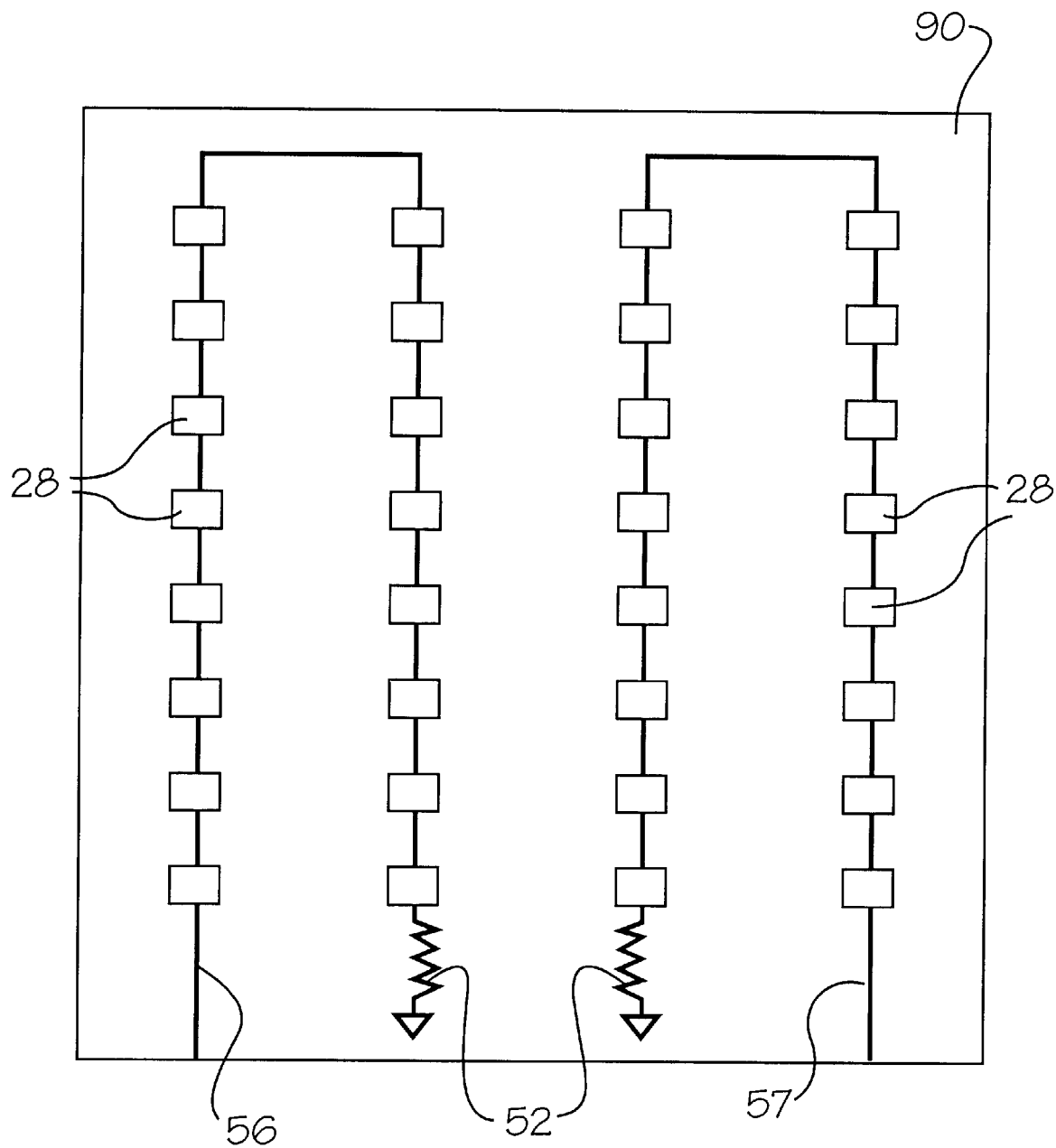
FIG. 8 is a front, schematic view of the selfterminating memory card adapted to support two memory channels.

Referring now to FIG. 8, there is shown a two channel RAMBUS module design utilizing a one channel socket of the prior art which further illustrates the advantage of the present invention. Two independent RAMBUS channels 56, 57 enter memory card 90. A plurality of memory devices 28 is connected to RAMBUS channels 56, 57. Independent terminations 52 located on card 90 properly terminate each of the RAMBUS channels 56, 57. The expanded memory module may have chips attached to both sides, and may be inserted into a socket of the conventional one channel design of the prior art.

While a RAMBUS-based memory subsystem has been chosen for purposes of disclosure, it should be obvious that the principles taught by the instant invention can be applied not only to other high speed memory subsystems, such as Double Data Rate (DDR) SDRAM from Micron Technology, but can also be readily applied to a wide-variety of electronic packaging structures for many other applications requiring high speed and high performance including but not limited to microprocessor-, digital signal processor-, and telecommunications-based applications and subsystems.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A self-terminating, high frequency memory module, comprising:
   a) a substrate;
   b) a plurality of electrical contacts disposed along at least one edge of said substrate adapted to connect to an external data bus;
   c) electrical connection means operatively connected to said plurality of electrical contacts forming an extension of said external data bus;
   d) a plurality of devices mounted on said substrate selectively connected to said data bus extension; and
   e) bus termination means located on said substrate, forming an integral part of said memory module and said bus termination means being operatively connected to said data bus extension and ending at said bus termination means;
whereby said self-terminating, high frequency memory module provides high electrical design margins.

2. The self-terminating, high-frequency module as recited in claim 1, wherein said external data bus comprises a characteristic impedance and said bus termination exhibits an impedance substantially matching said characteristic impedance.

3. The self-terminating, high frequency module as recited in claim 2, wherein said bus terminating means comprises at least one from the group of resistors, capacitors and inductors disposed on said substrate and electrically connected to lines of said data bus extension.

4. The self-terminating, high frequency module as recited in claim 1, wherein said external data bus comprises a socket adapted to receive said plurality of electrical contacts.

5. The self-terminating, high frequency module as recited in claim 4, wherein said socket comprises spring contacts adapted to grip said plurality of electrical contacts thereby retaining said substrate in said socket and establishing an electrical connection between said external data bus and said electrical contacts.

6. The self-terminating, high frequency module as recited in claim 1, wherein said external data bus comprises at least two external data buses; said extension of said external data bus comprises at least two extensions of said at least two data buses; and said plurality of devices comprise at least two groups of devices, each group being independently connected to one of said at least two data bus extensions.

7. The self-terminating, high frequency module as recited in claim 1, wherein said module comprises a memory module.

8. The self-terminating, high frequency module as recited in claim 1, wherein said external data bus comprises an external memory bus.

9. A self-terminating, high frequency memory module, comprising:
   a) a substrate;
   b) a plurality of electrically-conductive pins along at least one edge of said substrate;
   c) electrical connection means operatively connected to said plurality of electrically-conductive pins forming an extension to an external data bus having a predetermined bus width;
   d) a plurality of devices mounted on said substrate selectively connected to said data bus extension; and
   e) bus termination means located on said substrate, forming an integral part of said memory module and said bus termination means being operatively connected to said data bus extension and ending at said bus termination means;
whereby said self-terminating, high frequency memory module provides high electrical design margins, thereby simplifying and cost reducing said substrate of said memory module.

10. The self-terminating, high frequency module as recited in claim 9, wherein said external data bus comprises a characteristic impedance and said bus termination exhibits an impedance substantially matching said characteristic impedance.

11. The self-terminating, high frequency module as recited in claim 10, wherein said bus terminating means comprises electrical components from the group: resistors, capacitors and inductors disposed on said substrate and electrically connected to respective lines comprising said data bus extension.

12. The self-terminating, high frequency module as recited in claim 11, wherein said resistors comprise discrete resistors.

13. The self-terminating, high frequency module as recited in claim 11, wherein said resistors comprise a resistor pack.

14. The self-terminating, high frequency module as recited in claim 11, wherein said resistors disposed on said substrate comprise a solid-state resistive device.

15. The self-terminating, high frequency module as recited in claim 9, wherein said external data bus comprises a plurality of plated through holes disposed in a printed circuit board structure adapted to receive and detachably retain said plurality of pins.

16. The self-terminating, high frequency module as recited in claim 9, wherein said module comprises a memory module.

17. The self-terminating, high frequency module as recited in claim 9, wherein said external data bus comprises an external memory bus.

* * * * *